(12) United States Patent
Kikuchi et al.

(10) Patent No.: US 11,450,589 B2
(45) Date of Patent: Sep. 20, 2022

(54) HEAT-CONDUCTIVE SHEET, MOUNTING METHOD USING SAME AND BONDING METHOD USING SAME

(71) Applicant: Fuji Polymer Industries Co., Ltd., Nagoya (JP)

(72) Inventors: Setsuo Kikuchi, Aichi (JP); Takumi Kataishi, Aichi (JP)

(73) Assignee: Fuji Polymer Industries Co., Ltd., Aichi (JP)

( * ) Notice: Subject to any disclaimer, the term of this patent is extended or adjusted under 35 U.S.C. 154(b) by 388 days.

(21) Appl. No.: 16/634,409

(22) PCT Filed: Apr. 23, 2019

(86) PCT No.: PCT/JP2019/017145
§ 371 (c)(1),
(2) Date: Jan. 27, 2020

(87) PCT Pub. No.: WO2019/216190
PCT Pub. Date: Nov. 14, 2019

(65) Prior Publication Data
US 2020/0176350 A1    Jun. 4, 2020

(30) Foreign Application Priority Data

May 8, 2018 (JP) .............................. JP2018-089655

(51) Int. Cl.
*C09J 183/04* (2006.01)
*H01L 23/373* (2006.01)
(Continued)

(52) U.S. Cl.
CPC ............ *H01L 23/3737* (2013.01); *C09J 5/00* (2013.01); *C09J 7/25* (2018.01); *C09J 7/38* (2018.01);
(Continued)

(58) Field of Classification Search
CPC ............. H01L 23/3737; H01L 21/4882; H01L 21/4871; H01L 23/42; C09J 5/00;
(Continued)

(56) References Cited

U.S. PATENT DOCUMENTS

2006/0154087 A1* 7/2006 Asaine ................ H01L 23/3737
257/E23.107
2016/0194529 A1    7/2016 Sugita

FOREIGN PATENT DOCUMENTS

EP    1 675 174    6/2006
JP    2001-110963    4/2001
(Continued)

OTHER PUBLICATIONS

JP 2006-188610, machine translation, retrieved Jul. 7, 2022.*
Extended European Search Report issued in corresponding European Application No. 19800151.3, 5 pages, dated Nov. 13, 2020.

*Primary Examiner* — Michael B Nelson
(74) *Attorney, Agent, or Firm* — Hamre, Schumann, Mueller & Larson, P.C.

(57) ABSTRACT

A heat conductive sheet of the present invention is a heat conductive sheet containing a curing reaction catalyst, wherein a heat conductive uncured composition 2 not containing a curing reaction catalyst is joined to at least one principal surface of the heat conductive sheet 1 containing a curing reaction catalyst. The heat conductive sheet 1 containing a curing reaction catalyst contains the curing reaction catalyst in an amount necessary to cure the heat conductive uncured composition. A mounting method of the present invention includes: joining a heat conductive uncured composition 2 not containing a curing reaction catalyst to at least one principal surface of the heat conductive sheet 1 containing a curing reaction catalyst, and curing the heat conductive uncured composition by diffusion of the curing reaction catalyst contained in the heat conductive sheet 1.

(Continued)

Thereby, the heat conductive uncured composition can be joined to the heat conductive sheet immediately before mounting to an electronic component or the like, easily follow the unevenness of a heat generating part and/or heat dissipating part, and cure after mounting.

16 Claims, 9 Drawing Sheets

(51) Int. Cl.
*C09J 7/25* (2018.01)
*C09J 7/38* (2018.01)
*C09J 5/00* (2006.01)
*C09K 5/14* (2006.01)
*H01L 21/48* (2006.01)

(52) U.S. Cl.
CPC ............ *C09K 5/14* (2013.01); *H01L 21/4882* (2013.01); *C09J 183/04* (2013.01); *C09J 2203/326* (2013.01); *C09J 2483/00* (2013.01); *C09J 2483/006* (2013.01); *Y10T 428/26* (2015.01); *Y10T 428/31663* (2015.04)

(58) Field of Classification Search
CPC ..... C09J 7/25; C09J 7/38; C09J 183/04; C09J 2203/326; C09J 2483/00; C09J 2483/006; C09J 2301/314; C09J 7/10; C09K 5/14; Y10T 428/26; Y10T 428/31663; B32B 25/042; B32B 25/08; B32B 25/12; B32B 25/20; B32B 2250/02; B32B 2250/24; B32B 2250/248; B32B 2264/1023; B32B 2307/302; B32B 2307/306; B32B 2405/00; B32B 2457/00; B32B 27/08; B32B 27/20; B32B 27/28; B32B 27/283; B32B 27/32; B32B 7/10; B32B 27/26; C08J 5/12; C08K 3/22; C08K 2003/2227; C08K 3/013

See application file for complete search history.

(56) References Cited

FOREIGN PATENT DOCUMENTS

| | | | |
|---|---|---|---|
| JP | 2004-130646 | | 4/2004 |
| JP | 2005-002208 | | 1/2005 |
| JP | 2006-188610 | | 7/2006 |
| JP | 2006-188610 | * | 12/2006 |
| JP | 2009-046528 | | 3/2009 |
| JP | 2009-203373 | | 9/2009 |
| JP | 2015-079948 | | 4/2015 |
| JP | 2017-005166 | | 1/2017 |
| JP | 2017-125138 | | 7/2017 |
| JP | 2017-206678 | | 11/2017 |
| WO | 2017/038079 | | 3/2017 |

* cited by examiner

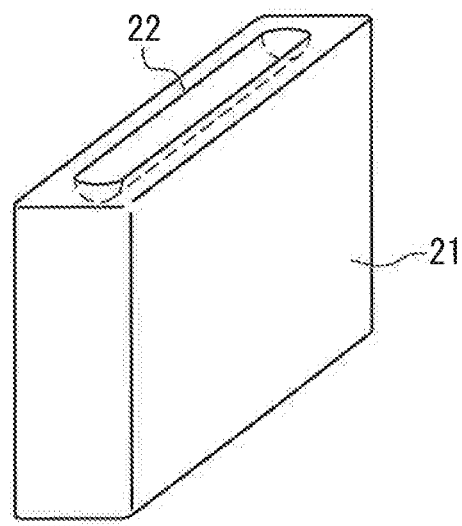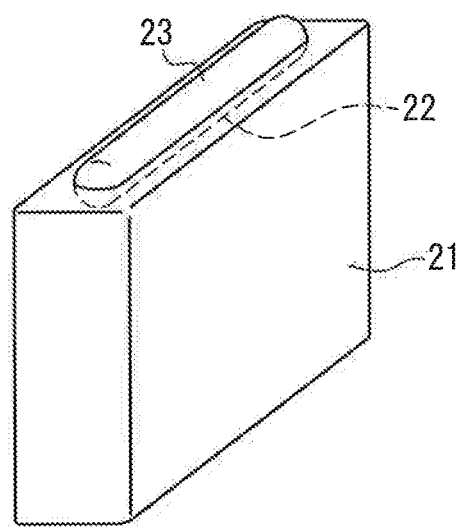
FIG. 9A  FIG. 9B
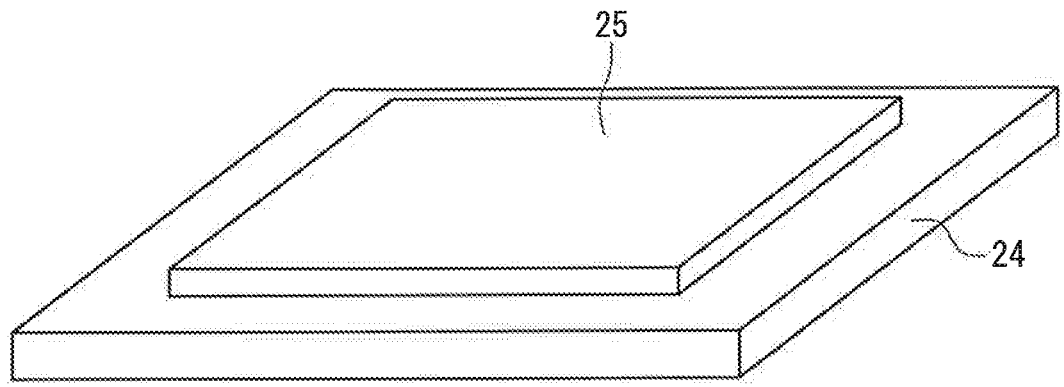
FIG. 9C
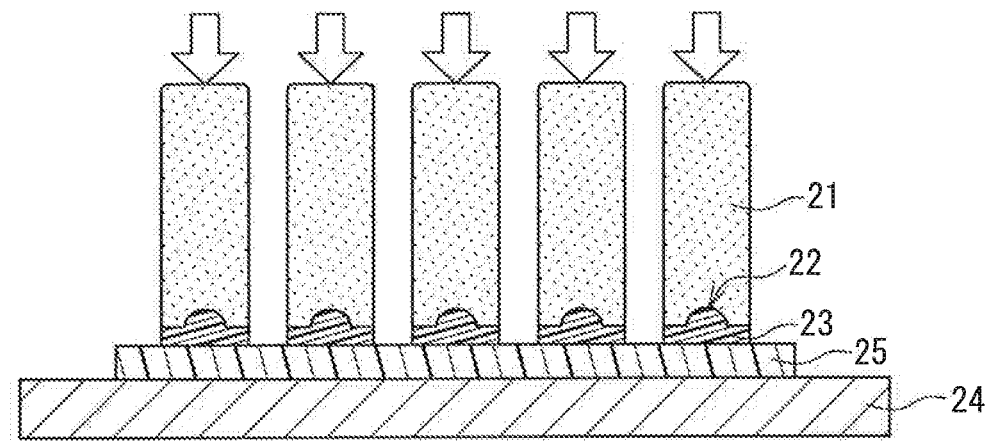
FIG. 9D

HEAT-CONDUCTIVE SHEET, MOUNTING METHOD USING SAME AND BONDING METHOD USING SAME

TECHNICAL FIELD

The present invention relates to a heat conductive sheet containing a curing catalyst to which an uncured composition can be applied and/or pressure-bonded immediately before mounting to an electrical or electronic component, a mounting method using the heat conductive sheet, and a joining method using the heat conductive sheet.

BACKGROUND ART

Recently, the performance of semiconductors such as CPUs has improved appreciably, and the amounts of heat generated by the semiconductors have increased enormously. To cope with this, heat dissipaters are attached to electronic components that generate heat, and heat conductive silicone sheets are adopted to improve the contact between the semiconductors and the heat dissipaters. Further, along with the size reduction, high performance, and high integration of devices, the heat conductive silicone sheets are required to have softness, high heat conductivity and thinness. Further, to cut the production costs, automatic mounting is demanded. Patent Documents 1-4 propose addition reaction-type heat conductive silicone gel sheets.

PRIOR ART DOCUMENTS

Patent Documents

Patent Document 1: JP 2017-125138 A
Patent Document 2 JP 2017-206678 A
Patent Document 3: JP 2017-005166 A
Patent Document 4: JP 2009-203373A

DISCLOSURE OF INVENTION

Problem to be Solved by the Invention

The conventional addition reaction-type heat conductive cured silicone sheets, however, have difficulty following the unevenness of a heat generating part and/or a heat dissipating part, and need to be improved. One-pack type and two-pack type liquid silicone rubbers have good ability to follow to the unevenness of a heat generating part and/or a heat dissipating part, but there are restrictions on the expiration date in use, and mixing and defoaming are necessary before use, which complicates handling. Grease also has good ability to follow to the unevenness, but since the grease does not cure, it may cause a serious problem such as pump-out, which leads to a malfunction when used for a long period of time.

To solve the above conventional problems, the present invention provides a heat conductive sheet containing a curing catalyst to which an uncured composition, which easily follows the unevenness of a heat generating part and/or a heat dissipating part, can be joined, pressure-bonded, or applied immediately before mounting to an electronic component, and that can cure the uncured composition after mounting, a mounting method using the heat conductive sheet, and a joining method using the heat conductive sheet.

Means for Solving Problem

A heat conductive sheet of the present invention is a heat conductive sheet containing a curing reaction catalyst, wherein a heat conductive uncured composition not containing a curing reaction catalyst is joined to at least one principal surface of the heat conductive sheet containing a curing reaction catalyst. The heat conductive sheet containing a curing reaction catalyst contains the curing reaction catalyst in an amount necessary to cure the heat conductive uncured composition.

A mounting method using the heat conductive sheet of the present invention is a mounting method using the heat conductive cured sheet, including: joining a heat conductive uncured composition not containing a curing reaction catalyst to at least one principal surface of the heat conductive sheet containing a curing reaction catalyst: and curing the heat conductive uncured composition by diffusion of the curing reaction catalyst contained in the heat conductive sheet.

A joining method using the heat conductive sheet of the present invention includes joining an uncured composition and an object in contact with the uncured composition by tackiness of the uncured composition after curing.

Effects of the Invention

The present invention can provide a heat conductive sheet containing a curing catalyst to which a heat conductive uncured composition, which easily follows the unevenness of a heat generating part and or a heat dissipating part, can be joined immediately before mounting to an electrical or electronic component and that can cure the uncured composition after mounting, a mounting method using the heat conductive sheet, and a joining method of an electrical or electronic component using the heat conductive sheet. That is, the uncured composition can be joined to the heat conductive sheet containing a curing catalyst immediately before mounting to, e.g., an electronic component, and deform freely to follow the unevenness of a heat generating part and/or a heat dissipating part. Further, an electrical or electronic component to which an uncured composition is pressure-bonded or applied may be pressure-bonded to a heat conductive sheet containing a curing catalyst. After mounting, the uncured composition cures by the addition reaction catalyst contained in the heat conductive sheet. Thus, the surface of the heat conductive sheet can undergo suction, and pick and place mounting using an automatic mounting machine is possible. The heat conductive sheet layer and the uncured composition layer are united by curing. Further, electrical and electronic components can be joined easily.

BRIEF DESCRIPTION OF DRAWINGS

FIG. 9A is a schematic perspective view of an electrical or electronic component in one embodiment of the present invention, FIG. 9B is a schematic perspective view illustrating a state in which an uncured composition is extruded onto the surface of the electrical or electronic component, FIG. 9C is a schematic perspective view illustrating a state in which a heat conductive silicone rubber sheet is joined to a metal plate, and FIG. 9D is a schematic partial cross-sectional view illustrating a state in which the uncured composition on the surface of the electrical or electronic component is pressure-bonded to the heat conductive silicone rubber sheet.

DESCRIPTION OF THE INVENTION

Figure 1:
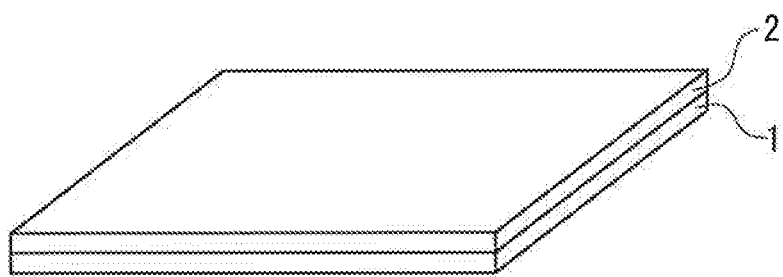
FIG. 1 is a perspective view of a heat conductive silicone rubber sheet in one embodiment of the present invention.

A heat conductive sheet of the present invention is a heat conductive sheet containing a curing catalyst on at least one principal surface of which a heat conductive uncured composition not containing a curing catalyst is stacked to cure the uncured composition. The heat conductive sheet containing a curing catalyst includes an addition reaction catalyst for curing the uncured composition. The uncured composition can be joined or applied to the heat conductive sheet immediately before mounting to an electrical or electronic component. The uncured composition can deform freely and follow easily the unevenness of a heat generating part and/or a heat dissipating part. After mounting, the addition reaction catalyst or condensation reaction catalyst contained in the heat conductive sheet cures the uncured composition. Furthermore, even after the uncured composition is joined to the heat conductive sheet containing an addition reaction catalyst or condensation reaction catalyst, the surface of the heat conductive sheet can undergo suction, and thus pick and place mounting using an automatic mounting machine is possible.

The curing mechanism of the uncured composition, which is cured by the curing catalyst contained in the heat conductive sheet, may be either condensation such as deacetylation, deoximation or dealcoholization, or addition reaction curing by hydroxylation. The curing mechanism is preferably addition reaction curing because it is not corrosive to surroundings, by-products released out of the system are few, and the composition cures to the core reliably.

The addition reaction catalyst is preferably a platinum group metal catalyst. Any known catalyst used for hydrosilylation reaction can be used as the platinum group metal catalyst. Examples of the catalyst include platinum group metal catalysts such as platinum-based, palladium-based, and rhodium-based catalysts. The platinum-based catalysts include, e.g., platinum black, platinum chloride, chloroplatinic acid, a reaction product of chloroplatinic acid and monohydric alcohol, a complex of chloroplatinic acid and olefin or vinylsiloxane, and platinum bisacetoacetate.

The amount of the addition reaction catalyst to cure the uncured composition is preferably 1 to 3500 ppm, more preferably 5 to 2000 ppm, and further preferably 7 to 700 ppm with respect to the polymer components. When the uncured composition is applied and/or pressure-bonded to the heat conductive sheet containing a curing catalyst, the reaction catalyst contained in the heat conductive sheet cures the uncured composition. The mechanism to cure the uncured composition is that the reaction catalyst contained in the heat conductive sheet permeates and diffuses through the uncured composition to cure the uncured composition. The heat conductive sheet layer and the uncured composition layer are united by curing.

The heat conductive sheet containing a curing catalyst is preferably a sheet made of at least one material selected from silicone gum, silicone rubber, silicone gel, natural rubber, synthetic rubber, and paraffin. These may be either cured materials or uncured materials. A cured sheet is preferred from the viewpoint of long-term reliability. Further, a silicone rubber cured sheet and a silicone gel cured sheet are more preferred from the viewpoint of the high heat resistance.

The uncured composition is preferably at least one selected from uncured silicone gum, uncured silicone rubber, uncured silicone gel, uncured silicone grease, uncured silicone oil coating, uncured adhesive silicone rubber, uncured natural rubber, uncured synthetic rubber, and uncured paraffin. Among these, uncured silicone rubber, uncured silicone gel, uncured silicone grease, uncured silicone oil, and uncured adhesive silicone rubber are more preferred because of high heat resistance.

Preferably, a heat conductive filler is mixed in the heat conductive (cured) sheet containing a curing catalyst and the uncured composition. The heat conductive filler may be either an electroconductive filler or an electric insulation filler Examples of the electroconductive filler include carbon powder such as carbon black and metal powder. When metal powder is used as the filler, metal powders having a surface resistance of 1Ω/□ or less are preferred, and specific examples thereof include: powders of metals such as gold, silver, platinum, copper, nickel, iron, palladium, cobalt, chromium and aluminum, and powders of alloys such as stainless steel; and metal powders coated with noble metals such as gold and silver in terms of reducing the electrical resistance. Preferable examples of the electric insulation filler include alumina, zinc oxide, magnesium oxide, aluminum nitride, boron nitride, aluminum hydroxide, quartz, and silica. The filler may have various shapes such as spherical, scaly and polyhedral. When alumina is used, α-alumina with a purity of 99.5 wt % or more is preferred. The specific surface area of the heat conductive particles is preferably in a range from 0.06 to 10 $m^2/g$. The specific surface area is a BET specific surface area and is measured in accordance with JIS R 1626. The average particle diameter of the heat conductive particles is preferably in a range from (11 to 100 μm. The average particle diameter means D50 (median diameter) in a volume-based cumulative particle size distribution, which is determined by a particle size distribution measurement with a laser diffracted light scattering method. The measuring device may be, e.g., a laser diffraction/scattering particle size distribution analyzer LA-950S2 manufactured by HORIBA, Ltd. Preferably, the silicone sheet has a heat conductivity of 0.5 W/m·k or more. The more preferable heat conductivity is 0.7 W/m·k or more.

Preferably the heat conductive sheet containing a curing catalyst, has a thickness of 0.1 mm to 1.5 mm. Preferably a sheet-like uncured composition has a thickness of 0.5 mm to 3.0 mm. Preferably, a rod-shaped uncured composition has a diameter of 0.5 mm to 3.0 mm and a length of 50 mm to 300 mm. Preferably, a ribbon-shaped uncured composition has a thickness of 0.5 mm to 3.0 mm and a width of 5 mm to 50 mm, and an applied uncured composition has a thickness of 0.5 mm to 3.0 mm. The above ranges are suitable for incorporation into heat generating electrical and electronic components.

Preferably, cover films are disposed on upper and lower surfaces of the heat conductive sheet containing a curing catalyst. By disposing the cover films on the upper and lower surfaces, the silicone sheet can be handled easily and protected. To pick and place the silicone sheet using an automatic mounting machine, at least one of the upper and lower cover films is peeled off, and the silicone sheet is arranged on a carrier tape and supplied to the automatic mounting machine.

Preferably, the heat conductive uncured composition has tackiness after curing. If the uncured composition has tackiness after curing, the uncured composition can be joined to an object that is in contact with the uncured composition by the tackiness of the uncured composition after curing. The tackiness of the heat conductive uncured composition after curing is preferably 0.5 N or more, more preferably 1.0 N or more, and further preferably 1.5 N or more by a tackiness checker.

Preferably the heat conductive uncured composition is in a form of a putty sheet or a ribbon, or in a state extruded from at least one container selected from a dispenser, a syringe, and a tube. Therefore, the heat conductive uncured composition is supplied to a mounting process in a form of a putty sheet or a ribbon, or in a state of being contained in a dispenser, a syringe, or a tube.

The following is an example of the mounting method of the present invention.

(1) A heat conductive uncured composition is joined to at least one principal surface of a heat conductive sheet containing a curing reaction catalyst, and the heat conductive sheet in this state is incorporated into an electrical or electronic component so that the uncured composition cures after a certain period of time by the reaction catalyst contained in the heat conductive sheet.

(2) An electrical or electronic component to which a heat conductive uncured composition is joined is pressure-bonded to at least one principal surface of a heat conductive sheet containing a curing reaction catalyst so that the uncured composition cures after a certain period of time by the reaction catalyst contained in the heat conductive sheet.

(3) An electrical or electronic component to which a heat conductive sheet containing a curing reaction catalyst is joined is pressure-bonded to a heat conductive uncured composition so that the heat conductive uncured composition cures after a certain period of time by the reaction catalyst contained in the heat conductive sheet.

A time to cure the uncured composition is preferably 4 to 48 hours at a room temperature, and more preferably 12 to 24 hours at a room temperature. The above ranges improve efficiency of mounting. For example, a silicone sheet in which an uncured composition is joined and stacked on a heat conductive sheet containing a curing catalyst is subjected to pick and place mounting using an automatic mounting machine. This machine can perform, e.g., an air pressure adsorption and desorption pick and place.

Preferably the uncured composition is a composition with the following constitution:

(A) base polymer component: 100 parts by weight of linear organopolysiloxane having an average of two or more alkenyl groups per molecule, in which the alkenyl groups are bonded to silicon atoms at both ends of the molecular chain;

(B) crosslinking component: less than 1 mol of organohydrogenpolysiloxane having an average of two or more hydrogen atoms bonded to silicon atoms per molecule, with respect to 1 mol of the alkenyl groups bonded to the silicon atoms contained in the component A; and (C) heat conductive particles: 100 to 3000 parts by weight with respect to 100 parts by weight of the component A.

Preferably the heat conductive silicone sheet containing a curing catalyst has the following constitution;

(D) base polymer: 100 parts by weight of addition reaction curable or peroxide curable silicone rubber or silicone gel;

(E) platinum-based metal catalyst: 1 to 3500 ppm in weight unit with respect to the component D (10 to 35000 times the effective curing amount); and (F) heat conductive particles: 100 to 3000 parts by weight with respect to 100 parts by weight of the component D.

The following describes the respective components.

(1) Base Polymer Component (Component A)

The base polymer component is an organopolysiloxane having two or more alkenyl groups bonded to silicon atoms per molecule. The organopolysiloxane containing two alkenyl groups is a base (base polymer component) of the uncured composition of the present invention. In the organopolysiloxane, two alkenyl groups having 2 to 8 carbon atoms, and preferably 2 to 6 carbon atoms, such as vinyl groups or allyl groups, are bonded to the silicon atoms per molecule. The viscosity of the organopolysiloxane is preferably 10 to 1000000 mPa·s, and more preferably 100 to 100000 mPa·s at 25° C. in terms of workability and curability.

Specifically, a linear organopolysiloxane expressed by the following general formula (Chemical formula 1) is used. The organopolysiloxane has an average of two or more alkenyl groups per molecule, in which the alkenyl groups are bonded to silicon atoms at ends of the molecular chain. The viscosity of the linear organopolysiloxane is preferably 10 to 1000000 mPa·s at 25° C. in terms of workability and curability. Moreover, the linear organopolysiloxane may include a small amount of branched structure (trifunctional siloxane units) in the molecular chain,

[Chemical formula 1]

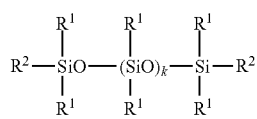

In the formula, $R^1$ represents substituted or unsubstituted monovalent hydrocarbon groups that are the same as or different from each other and have no aliphatic unsaturated bond, $R^2$ represents alkenyl groups, and k represents 0 or a positive integer. The substituted or unsubstituted monovalent hydrocarbon groups that have no aliphatic unsaturated bond represented by $R^1$ preferably have 1 to 10 carbon atoms, and more preferably 1 to (3 carbon atoms. Specific examples of the monovalent hydrocarbon groups include the following: alkyl groups such as methyl, ethyl, propyl, isopropyl, butyl, isobutyl, tert-butyl, pentyl, neopentyl, hexyl, cyclohexyl, octyl, nonyl, and decyl groups; aryl groups such as phenyl, tolyl, xylyl, and naphthyl groups; aralkyl groups such as benzyl, phenylethyl, and phenylpropyl groups; and substituted forms of these groups in which some or all hydrogen atoms are substituted by halogen atoms (fluorine, bromine, chlorine, etc.) or cyano groups, including halogen-substituted alkyl groups such as chloromethyl, chloropropyl, bromoethyl, and trifluoropropyl groups and cyanoethyl groups. The alkenyl groups represented by $R^2$ preferably have 2 to 6 carbon atoms, and more preferably 2 to 3 carbon atoms. Specific examples of the alkenyl groups include vinyl, allyl, propenyl, isopropenyl, butenyl, isobutenyl, hexenyl, and cyclohexenyl groups. In particular, the vinyl group is preferred. In the general formula (1), k is typically 0 or a positive integer satisfying $0 \leq k \leq 10000$, preferably $5 \leq k \leq 2000$, and more preferably $10 \leq k \leq 1200$.

The component A may also include an organopolysiloxane having three or more, typically 3 to 30, and preferably about 3 to 20, alkenyl groups bonded to silicon atoms per molecule. The alkenyl groups have 2 to 8 carbon atoms, and preferably 2 to 6 carbon atoms and can be, e.g., vinyl groups or allyl groups. The molecular structure may be a linear, ring, branched, or three-dimensional network structure. The organopolysiloxane, is preferably a linear organopolysiloxane in which the main chain is composed of repeating diorganosiloxane units, and both ends of the molecular chain are blocked with triorganosiloxy groups. The viscosity of the linear organopolysiloxane is preferably 10 to 1000000 mPa·s, and more preferably 100 to 100000 mPa·s at 25° C.

Each of the alkenyl groups may be bonded to any part of the molecule. For example, the alkenyl group may be bonded to either a silicon atom that is at the end of the molecular chain or a silicon atom that is not at the end (but in the middle) of the molecular chain. In particular, a linear organopolysiloxane expressed by the following general formula (Chemical formula 2) is preferred. The linear organopolysiloxane has 1 to 3 alkenyl groups on each of the silicon atoms at both ends of the molecular chain, in this case, however, if the total number of the alkenyl groups bonded to the silicon atoms at both ends of the molecular chain is less than 3, at least one alkenyl group is bonded to the silicon atom that is not at the end (but in the middle) of the molecular chain (e.g., as a substituent in the diorganosiloxane unit). As described above, the viscosity of the linear organopolysiloxane is preferably 10 to 1000000 mPa·s at 25° C. in terms of workability and curability. Moreover, the linear organopolysiloxane may include a small amount of branched structure (trifunctional siloxane units) in the molecular chain.

[Chemical Formula 2]

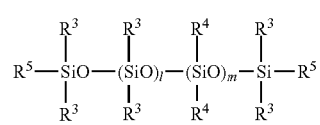

In the formula, $R^3$ represents substituted or unsubstituted monovalent hydrocarbon groups that are the same as or different from each other; and at least one of them is an alkenyl group, $R^4$ represents substituted or unsubstituted monovalent hydrocarbon groups that are the same as or different from each other and have no aliphatic unsaturated bond, and $R^5$ represents alkenyl groups, and l and m represent 0 or a positive integer. The monovalent hydrocarbon groups represented by $R^3$ preferably have 1 to 1.0 carbon atoms, and more preferably 1 to 6 carbon atoms. Specific examples of the monovalent hydrocarbon groups include the following: alkyl groups such as methyl, ethyl, propyl, isopropyl, butyl, isobutyl, tert-butyl, pentyl, neopentyl, hexyl, cyclohexyl, octyl, nonyl, and decyl groups; aryl groups such as phenyl, xylyl, and naphthyl groups; aralkyl groups such as benzyl, phenylethyl, and phenylpropyl groups; alkenyl groups such as vinyl, allyl, propenyl, isopropenyl, butenyl, hexenyl, cyclohexenyl, and octenyl groups; and substituted forms of these groups in which some or all hydrogen atoms are substituted by halogen atoms (fluorine, bromine, chlorine, etc.) or cyano groups, including halogen-substituted alkyl groups such as chloromethyl, chloropropyl, bromoethyl, and trifluoropropyl groups and cyanoethyl groups.

The monovalent hydrocarbon groups represented by $R^4$ also preferably have 1 to 10 carbon atoms, and more preferably 1 to 6 carbon atoms. The monovalent hydrocarbon groups may be the same as the specific examples of $R^1$, but do not include an alkenyl group. The alkenyl groups represented by $R^5$ preferably have 2 to 6 carbon atoms, and more preferably 2 to 3 carbon atoms. Specific examples of the alkenyl groups are the same as those of $R^2$ in the general formula (Chemical formula 1), and the vinyl group is preferred. In the general formula (2), l and m are typically 0 or positive integers satisfying $0<l+m \leq 10000$, preferably $5 \leq l+m \leq 2000$, and more preferably $10 \leq l+m \leq 1200$. Moreover, l and m are integers satisfying $0<l/(l+m) \leq 0.2$; and preferably $0.0011 \leq l/(l+m) \leq 0.1$.

(2) Crosslinking Component (Component B)

The component B of the present invention is an organohydrogenpolysiloxane that acts as a crosslinker. The addition reaction (hydrosilylation) between SiH groups in the component B and alkenyl groups in the component A produces a cured product. Any organohydrogenpolysiloxane that has two or more hydrogen atoms (i.e., SiH groups) bonded to silicon atoms per molecule may be used. The molecular structure of the organohydrogenpolysiloxane may be a linear, ring, branched, or three-dimensional network structure. The number of silicon atoms in a molecule (i.e., the degree of polymerization) may be 2 to 1000, and preferably about 2 to 300.

[Chemical formula 3]

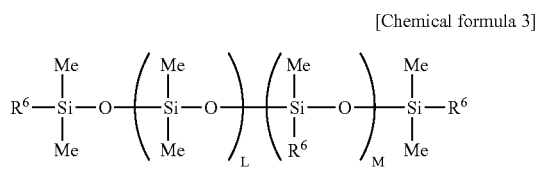

In the formula above, $R^6$ represents hydrogen, alkyl group, phenyl group, epoxy group, acryloyl group, methacryloyl group, and alkoxy group that are the same as or different from each other, and at least two of them are hydrogen. L is an integer of 0 to 1000, and particularly an integer of 0 to 300, and M is an integer of 1 to 200.

(3) Catalyst Component (Component E)

The catalyst component (component E) may be a catalyst used for a hydrosilylation reaction. Examples of the catalyst include platinum group metal catalysts such as platinum-based, palladium-based, and rhodium-based catalysts. The platinum-based catalysts include, e.g., platinum black, platinum chloride, chloroplatinic acid, a reaction product of chloroplatinic acid and monohydric alcohol, a complex of chloroplatinic acid and olefin or vinylsiloxane, and platinum bisacetoacetate. The catalyst is preferably added in an amount of 1 to 3500 ppm in weight unit with respect to the component D (10 to 35000 times the effective curing amount).

(4) Heat Conductive Particles (Components C and F)

The heat conductive particles (components C and F) are preferably added in an amount of 100 to 3000 parts by weight with respect to 100 parts by weight of the matrix component (component A). The addition of the heat conductive particles can maintain high heat conductivity. The heat conductive particles are preferably composed of at least one selected from alumina, zinc oxide, magnesium oxide, aluminum nitride, boron nitride, aluminum hydroxide, quartz, and silica. The heat conductive particles may have various shapes such as spherical, scaly-, and polyhedral. When alumina is used, α-alumina with a purity of 99.5 wt % or more is preferred. The specific surface area of the heat conductive particles is preferably 0.06 to 10 m$^2$/g. The specific surface area is a BET specific surface area and is measured in accordance with JIS R 1626. The average particle diameter of the heat conductive particles is preferably 0.1 to 100 μm. The particle diameter may be measured with a laser diffracted light scattering method to determine the median diameter. The method may use, e.g., a laser diffraction/scattering particle size distribution analyzer LA 95052 manufactured by HORIBA, Ltd.

The heat conductive particles may include at least two types of inorganic particles with different average particle diameters. This is because small-size heat conductive inorganic particles fill the spaces between large-size inorganic particles, which can provide nearly the closest packing and improve the heat conductivity.

It is preferable that the inorganic particles are surface treated with a silane compound or its partial hydrolysate. The silane compound is expressed as $R_aSi(OR')_{3-s}$, where R represents a substituted or unsubstituted organic group having 1 to 20 carbon atoms, R' represents an alkyl group having 1 to 4 carbon atoms, and a is 0 or 1. Examples of an alkoxysilane compound (simply referred to as "silane" in the following) expressed as $R_aSi(OR')_{3-s}$, where R represents a substituted or unsubstituted organic group having 1 to 20 carbon atoms, R' represents an alkyl group having 1 to 4 carbon atoms, and a is 0 or 1, include the following: methyltrimethoxysilane; ethyltrimethoxysilane; propyltrimethoxysilane; butyltrimethoxysilane; pentyltrimethosilane; hexyltrimethoxysilane; hexyltriethoxysilane; octyltrimethoxysilane; octyltriethoxysilane; decyltrimethoxysilane; decyltriethoxysilane; dodecyltrimethoxysilane; dodecyltriethoxysilane; hexadecyltrimethoxysilane; hexadecyltriethoxysilane; octadecyltrimethoxysilane; and octadecyltriethoxysilane. These silane compounds may be used individually or in combinations of two or more. The alkoxysilane and one-end silanol siloxane may be used together as the surface treatment agent. In this case, the surface treatment may include adsorption in addition to a covalent bond. The particles with an average particle diameter of 2 μm or more are preferably added in an amount of at least 50 wt % when the total amount of the particles is 100 wt %.

(5) Addition Reaction Curable or Peroxide Curable Silicone Rubber or Silicone Gel (Component D)

The heat curable silicone rubber or gel to be applied may be, e.g., dimethyl silicone rubber or gel, methyl vinyl silicone rubber or gel, methyl phenyl vinyl silicone rubber or gel, or fluorosilicone rubber or gel. Generally various types of fillers and additives are used for the silicone rubber or gel as needed, but there are no particular limitations on these. Fillers such as reinforcing silica typified by silica gel and AEROSIL (registered trademark) #200 (trade name), and diatomaceous earth typified by Celite (registered trademark) may be used, and additives such as a processing aid, a flame retarder, a heat resistance improver, a plasticizer, and a pigment may be used as needed. The silicone rubber or gel curing system can be either addition reaction curing or peroxide curing, or the silicone rubber or gel may not be in a cured state.

(6) Other Components

The composition of the present invention may include components other than the above as needed. For example, the composition may include a heat resistance improver such as colcothar, titanium oxide or cerium oxide, a flame retardant aid, and alkyltrialikoxysilane for the surface treatment of a filler. Moreover, alkoxy group-containing silicone may be added for the surface treatment of a filler. An adhesion promoter such as a silane coupling agent may be added. An organic or inorganic pigment may be added for coloring and toning.

Hereinafter, the present invention will be described with reference to the drawings. The same components are denoted with the same reference numerals in the drawings. FIG. 1 is a perspective view of a silicone gel sheet in one embodiment of the present invention. An uncured sheet 2 not containing a curing catalyst is joined to the surface of a cured sheet 1 immediately before mounting to a heat generating electronic component, and thereafter the silicone gel sheet is mounted to the electronic component. The cured sheet 1 contains an excess amount of an addition reaction catalyst to cure the uncured sheet. 2, so that after mounting, the uncured sheet 2 cures, e.g., in 24 hours at room temperature.

Figure 2A:
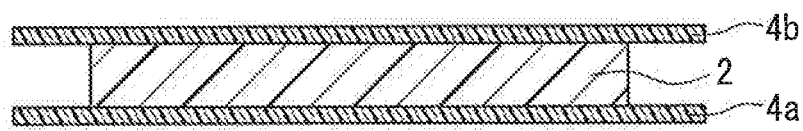
FIG. 2A is a cross-sectional view of a silicone gel uncured composition.
Figure 2B:
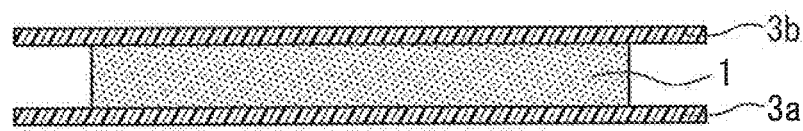
FIG. 2B is a cross-sectional view of a cured sheet.
Figure 2C:
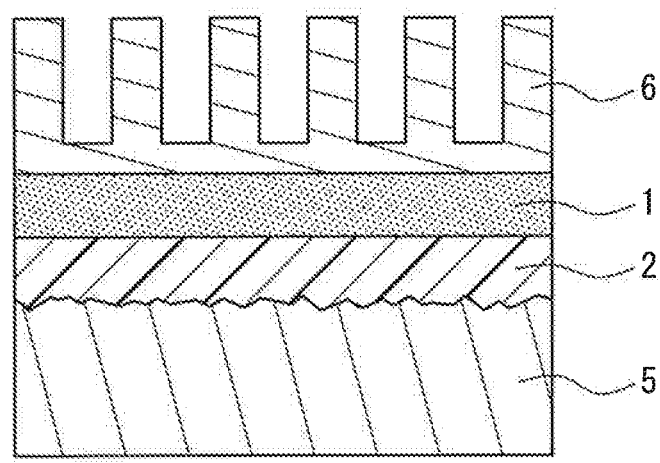
FIG. 2C is a schematic cross-sectional view illustrating a state in which they are mounted between a heat generating part of an electronic component and a heat sink.

FIG. 2A is a cross-sectional view of a silicone gel uncured composition 2, FIG. 2B is a cross-sectional view of a cured sheet 1, and FIG. 2C is a schematic cross-sectional view illustrating a state in which they are mounted in a heat generating part of an electronic component 5. Both of the cured sheet 1 and the uncured sheet 2 are protected by protective films 3a, 3b and 4a, 4b, respectively, and the protective films 3b and 4a are peeled off therefrom immediately before mounting to the heat generating electronic component 5. The protective films may be polyester (PET) films. The uncured sheet 2 deforms freely and follows the unevenness of the heat generating electronic component 5 in mounting. A heat sink 6 may also be arranged on the uncured sheet 2 side. Since the cured sheet 1 contains an excess amount of an addition reaction catalyst to cure the uncured sheet 2, the uncured sheet 2 cures, e.g., in 24 hours at room temperature after mounting.

FIGS. 3A to 3E are process drawings of pick and place mounting using an automatic mounting machine in one embodiment of the present invention.

Figure 3A:
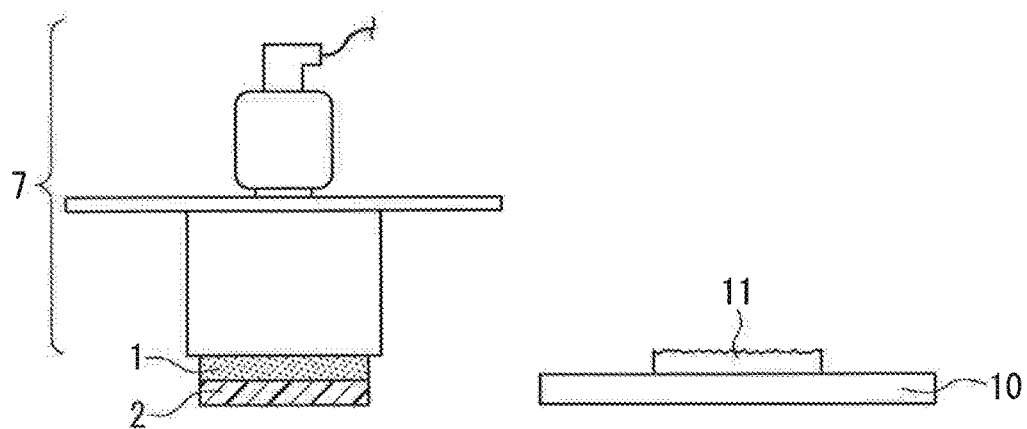
FIG. 3A is an explanatory view illustrating a state in which a tip part of an automatic mounting machine moves to the surface of a heat conductive silicone rubber sheet in pick and place mounting using an automatic mounting machine in one embodiment of the present invention.

(1) FIG. 3A is an explanatory view illustrating a state in which an automatic mounting machine 7 moves to the surface of a silicone sheet 1. An uncured sheet 2 is joined to the lower surface of the cured sheet 1 in advance. Laminates of the cured sheets 1 and the uncured compositions 2 are arranged on a earlier tape (not illustrated) and sent to the left side one by one. At a position on the right side apart therefrom, an electronic component 11 mounted with a CPU is arranged on a circuit board 10.

Figure 3B:
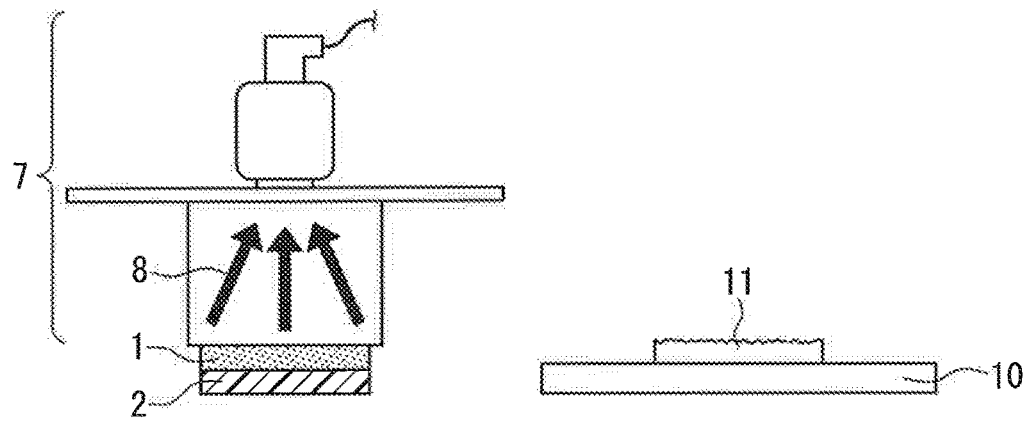
FIG. 3B is an explanatory view illustrating a state in which the tip part of the automatic mounting machine sucks air in directions of arrows to adsorb the cured sheet.

(2) FIG. 3B is an explanatory view illustrating a state in which a tip part of the automatic mounting machine 7 sucks air in directions of arrows 8 to adsorb the cured sheet 1. The uncured composition 2 is joined to the lower surface of the cured sheet 1 in. advance.

Figure 3C:
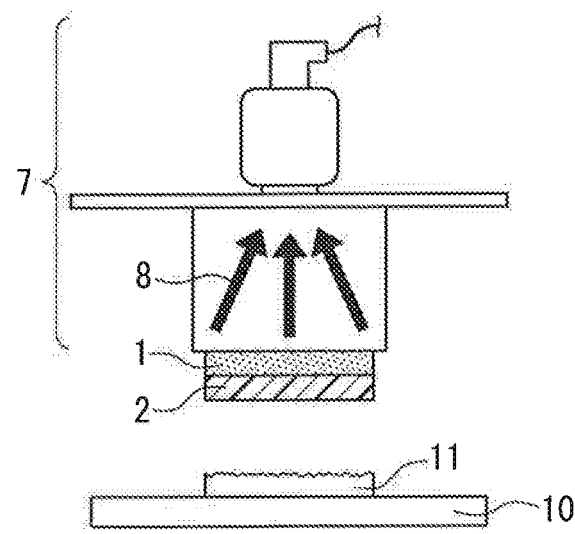
FIG. 3C is an explanatory view illustrating a state in which the tip part of the automatic mounting machine in the state of adsorbing the heat conductive silicone rubber sheet moves to a position above an electronic component on which a heat generating part is to be mounted.

(3) FIG. 3C is an explanatory view illustrating a state in which the tip part of the automatic mounting machine 7 in the state of adsorbing the cured sheet 1 moves to a position above the electronic component 11 mounted with a CPU.

Figure 3D:
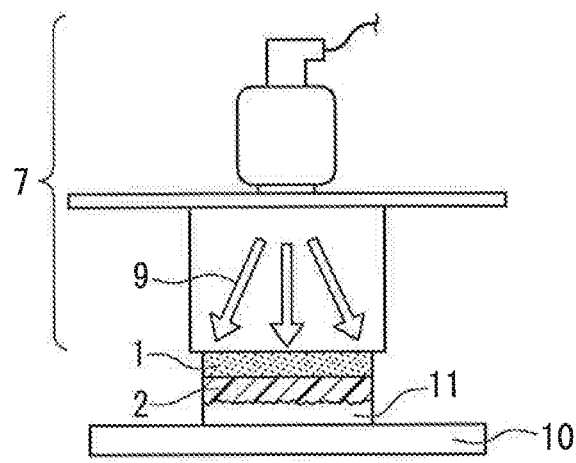
FIG. 3D is an explanatory view illustrating a state in which the heat conductive silicone rubber sheet is set on the electronic component, and air is released to mount the silicone sheet on the electronic component.

(4) FIG. 3D is an explanatory view illustrating a state in which the cured sheet 1 is set on the electronic component 11, and air is released as indicated by arrows 9 to mount the cured sheet 1 and the uncured composition. 2 on the electronic component 11.

Figure 3E:
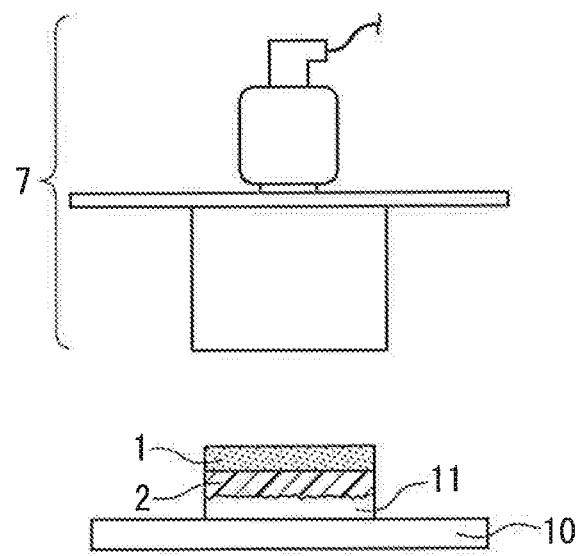
FIG. 3E is an explanatory view illustrating a state in which the tip part of the automatic mounting machine moves upward to complete one cycle.

(5) FIG. 3E is an explanatory view illustrating a state in which the tip part of the automatic mounting machine 7 moves upward to complete one cycle.

Figure 4A:
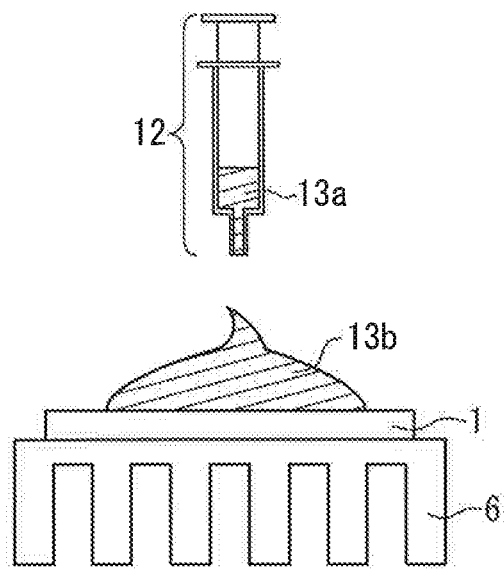
FIG. 4A is a schematic cross-sectional view illustrating a state in which an uncured composition is extruded from a dispenser onto the surface of a heat conductive silicone rubber sheet in another embodiment of the present invention.
Figure 4B:
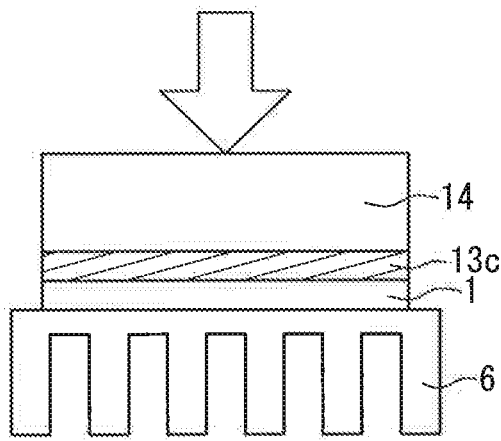
FIG. 4B is a schematic cross-sectional view illustrating a state of joining to an electrical or electronic component.

FIG. is a schematic cross-sectional view illustrating a state in which an uncured composition 13h is extruded from a dispenser 12 onto the surface of a heat conductive silicone rubber cured sheet 1 in another embodiment of the present invention. The heat conductive silicone rubber cured sheet 1 contains an excess amount of an addition reaction catalyst to cure the uncured composition 13b. The cured sheet 1 and a heat sink 6 are joined together. The dispenser 12 with an uncured composition 13a stored therein is supplied to the mounting process. FIG. 4B is a schematic cross-sectional view in which an electrical or electronic component 14 is placed on and pressure-bonded to the uncured composition to form an uncured composition layer 13c. When the uncured composition layer 13c cures in this state, the cured sheet 1 is joined to the electrical or electronic component 14.

Figure 5A:
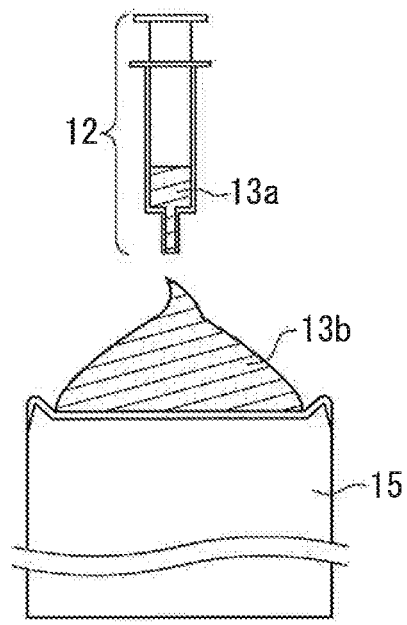
FIG. 5A is a schematic cross-sectional view illustrating a state in which an uncured composition is extruded from a dispenser onto the surface of an electrical or electronic component in still another embodiment of the present invention.
Figure 5B:
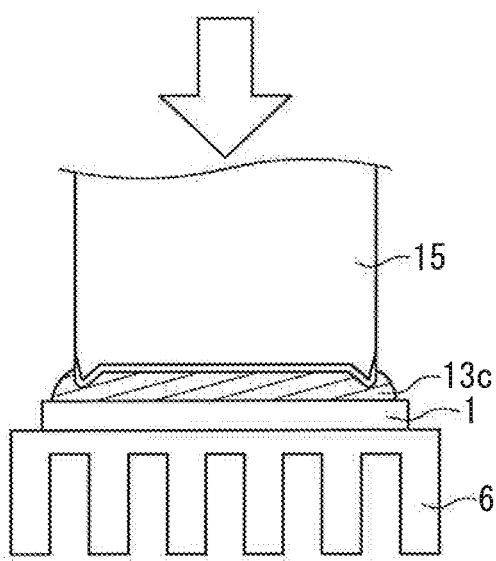
FIG. 5B is a schematic cross-sectional view illustrating a state in which the uncured composition is joined to the surface of a heat conductive silicone rubber sheet.

FIG. 5A is a schematic cross-sectional view illustrating a state in which an uncured composition 13b is extruded from the dispenser 12 onto the surface of an electrical or electronic component 15 in still another embodiment of the present invention, FIG. 5B is a schematic cross-sectional view illustrating a state in which an uncured composition 13c is joined to the surface of a heat conductive silicone rubber sheet 1. The uncured composition 13c follows the unevenness of the electrical or electronic component 15.

Figure 6:
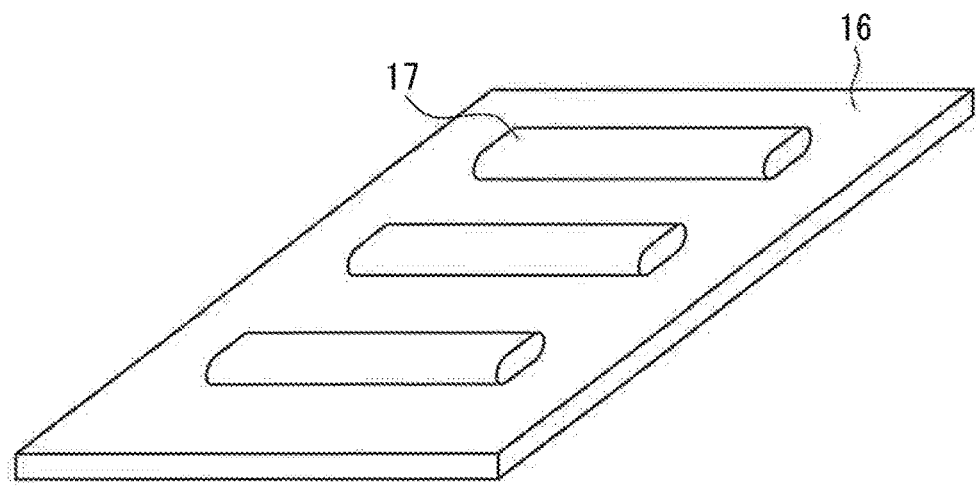
FIG. 6 is a schematic perspective view illustrating a state in which a rod-shaped uncured composition in one embodiment of the present invention is arranged on a tray to be supplied.
Figure 7:
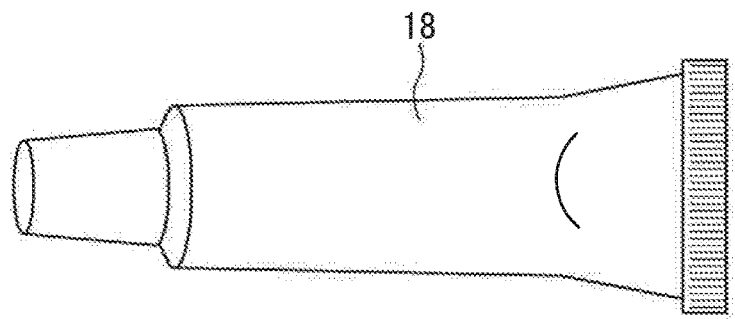
FIG. 7 is a schematic perspective view illustrating a state in which an uncured composition in another embodiment of the present invention is packed in a tube to be supplied.
Figure 8:
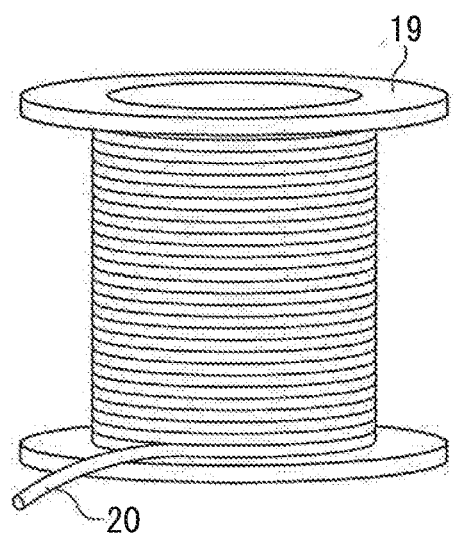
FIG. 8 is a schematic perspective view illustrating a state in which a ribbon-shaped uncured composition in still another embodiment of the present invention is wounded around a bobbin to be supplied.

FIGS. 6-8 are views illustrating a state in which an uncured composition is supplied to the mounting process. FIG. 6 is a schematic perspective view illustrating a state in which a rod-shaped uncured composition 17 in one embodiment of the present invention is arranged on a tray 16 to be supplied. FIG. 7 is a schematic perspective view illustrating a state in which an uncured composition in another embodiment of the present invention is packed in a tube 18 to be supplied. FIG. 8 is a schematic perspective view illustrating a state in which a ribbon-shaped uncured composition 20 in still another embodiment of the present invention is wounded around a bobbin 19 to be supplied. The ribbon-shaped uncured composition 20 may be wrapped with a resin film. Other than these, an uncured composition may be supplied in a state of being contained in a syringe.

FIG. 9A is a schematic perspective view of an electrical or electronic component 21 in one embodiment of the present invention. For example, a cavity (recess) 22 is formed on the electrical or electronic component 21 (e.g., a transformer, an amplifier, a battery) so that a rod-shaped uncured composition 23 is arranged in the cavity 22 as illustrated in FIG. 9B. A heat conductive silicone rubber cured sheet 25 is attached to a metal plate 24 in advance as illustrated in FIG. 9C. Then, the electrical or electronic component 21 of FIG. 9B is inverted as illustrated in FIG. 9D so that the uncured composition 23 is pressure-bonded to the heat conductive silicone rubber cured sheet 25. When the uncured composition layer 23 cures in this state, the electrical or electronic component 21 is joined to the metal plate 24 via the uncured composition 23 on the cured sheet 25.

Figure 10A:
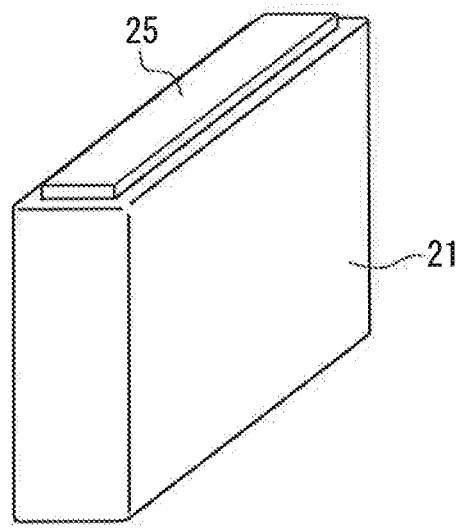
FIG. 10A is a schematic perspective view illustrating a state in which a cured sheet is arranged on an electrical or electronic component in still another embodiment of the present invention.
Figure 10B:
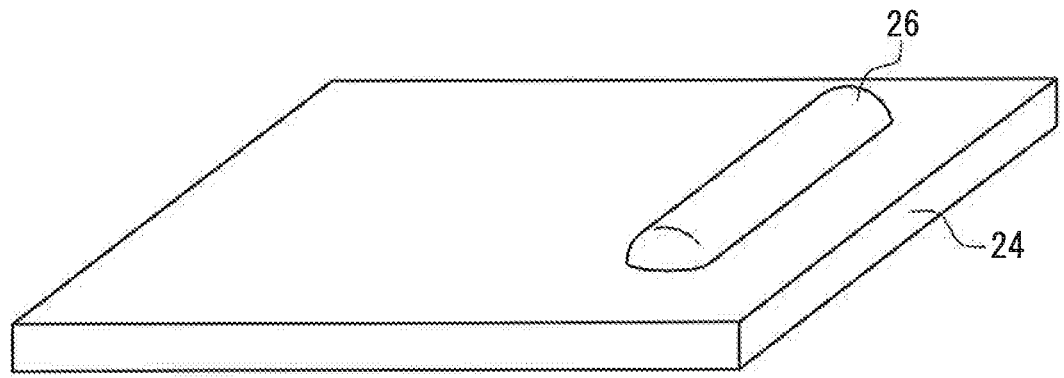
FIG. 10B is a schematic perspective view illustrating a state in which an uncured composition is dispensed on a metal plate.
Figure 10C:
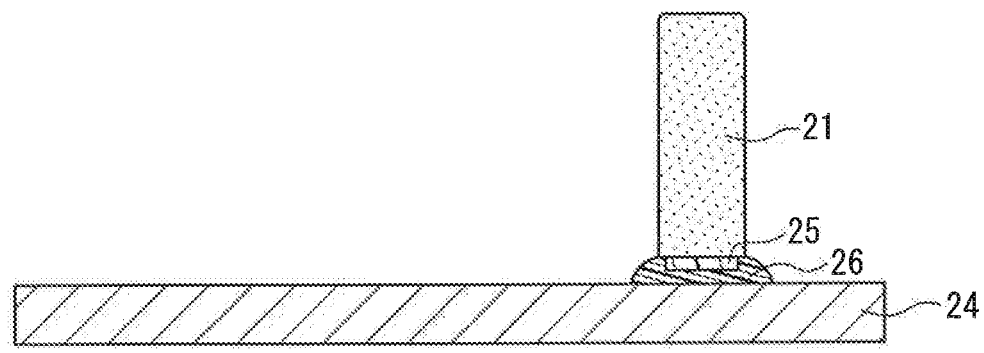
FIG. 10C is a schematic partial cross-sectional view illustrating a state in which the surface of the electrical or electronic component on the cured sheet side is pressure-bonded to the uncured composition on the metal plate.

FIG. 10A is a schematic perspective view illustrating a state in which a cured sheet 25 is arranged on an electrical or electronic component 21 in still another embodiment of the present invention, FIG. 10B is a schematic perspective view illustrating a state in which an uncured composition 26 is dispensed on a metal plate 24, and FIG. 10C is a schematic partial cross-sectional view illustrating a state in which the surface of the electrical or electronic component 21 on the cured sheet 25 side is pressure-bonded to the uncured composition 26 on the metal plate 24. When the uncured composition layer 26 cures in this state, the electrical or electronic component 21 is joined to the metal plate 24 via the uncured composition 26 on the cured sheet 25.

EXAMPLES

Hereinafter, the present invention will be described by way of examples. However, the present invention is not limited to the following examples.

Examples 1-8, Comparative Examples 1-2

(1) Preparation of Catalyst-Containing Sheet Blends 1:9
Blends 1-9 were prepared as indicated in Tables 1:2. The following were materials used for the blends 1:9.
Base polymer: Silicone polymer, trade name "SE1185U" manufactured by Dow Corning Toray Silicone Co., Ltd.
Base polymer: Silicone polymer, trade name "BS 62117350" manufactured by Bluestar Silicon Materials Co., Ltd.
Peroxide curing agent: Silicone curing agent, trade name "RC-4" manufactured by Dow Corning Toray Silicone Co., Ltd.

Crosslinker: Silicone crosslinker trade lame "BS FLD 6261730H2.5" manufactured by Bluestar Silicon Materials Co., Ltd.

Crosslinker: Silicone crosslinker, trade name "SH-1107" manufactured by Dow Corning Toray Silicone Co., Ltd.

Curing retarder: trade name "OLFINE (registered trademark) B" manufactured by Nissin Chemical Co Ltd.

Curing retarder: Ethynylcyclohexanol

Addition reaction catalyst: Platinum catalyst, trade name "SRX-212" manufactured by Dow Corning Toray Silicone Co., Ltd.

Heat conductive filler: Alumina (average particle diameter: 38 μm), trade name "AS 10" manufactured by SHOWA DENKO K.K.

TABLE 1

|  |  | Blend 1 (parts by mass) | Blend 2 (parts by mass) | Blend 3 (parts by mass) | Blend 4 (parts by mass) | Blend 5 (parts by mass) |
|---|---|---|---|---|---|---|
| Component | Base polymer: SE1185U | 100 | 100 | 0 | 100 | 100 |
|  | Base polymer: BS 621V350 | 0 | 0 | 100 | 0 | 0 |
|  | Peroxide curing agent: RC-4 | 0 | 0 | 0 | 0.5 | 0 |
|  | Crosslinker: BS FLD 626V30H2.5 | 0 | 0 | 2.8 | 0 | 0 |
|  | Crosslinker: SH-1107 | 0 | 0 | 0 | 0 | 0.4 |
|  | Curing retarder: OLFINE B | 0 | 0 | 0.04 | 0 | 0.04 |
|  | Curing retarder: Ethynylcyclohexanol | 0 | 0 | 0.015 | 0 | 0 |
|  | Catalyst: SRX-212 | 1 | 0 | 1 | 1 | 1 |
|  | Heat conductive filler: AS-10 | 500 | 500 | 500 | 300 | 300 |
| Curing mechanism |  | Uncured | Uncured | Addition reaction curing | Peroxide vulcanization | Addition reaction curing |
| Curing conditions | Temperature (° C.) | — | — | 150 | 170 | 150 |
|  | Time (min.) | — | — | 5 | 10 | 5 |
| Hardness |  | — | — | — | 75 (JIS) | 75 (JIS) |
| Nature |  | Uncured | Uncured | Gel | Rubber | Rubber |

TABLE 2

|  |  | Blend 6 (parts by mass) | Blend 7 (parts by mass) | Blend 8 (parts by mass) | Blend 9 (parts by mass) |
|---|---|---|---|---|---|
| Component | Base polymer: SE1185U | 0 | 0 | 0 | 100 |
|  | Base polymer: BS 621V350 | 100 | 100 | 100 | 0 |
|  | Peroxide curing agent: RC-4 | 0 | 0 | 0 | 0 |
|  | Crosslinker: BS FLD 626V30H2.5 | 2.8 | 2.8 | 2.8 | 0 |
|  | Crosslinker: SH-1107 | 0 | 0 | 0 | 1.5 |
|  | Curing retarder: Ethynylcyclohexanol | 0.015 | 0.015 | 0.015 | 0 |
|  | Catalyst: SRX-212 | 1 | 0.4 | 0.01 | 0 |
|  | Heat conductive filler: AS-10 | 500 | 500 | 500 | 500 |
| Curing mechanism |  | Addition reaction curing | Addition reaction curing | Addition reaction curing | Uncured |
| Curing conditions | Temperature (° C.) | 150 | 150 | 150 | — |
|  | Time (min.) | 5 | 5 | 5 | — |
| Hardness |  | O (Asker C) | O (Asker C) | O (Asker C) | — |
| Nature |  | Gel | Gel | Gel | Uncured |

(2) Preparation of Uncured Composition Blends 10-12

Blends 10-12 were prepared as indicated in Table 3. The following were materials used for the blends 10-12.

Base polymer: Silicone polymer, trade name "BS 621V350" manufactured by Bluestar Silicon Materials Co., Ltd.

Crosslinker: Silicone crosslinker, trade name "BS FLD 626V30112.5" manufactured by Bluestar Silicon Materials Co., Ltd.

Heat conductive filler: lumina (average particle diameter: 38 μm), trade name "AS-10" manufactured by SHOWA DENKO K.K.

Addition reaction catalyst: Platinum catalyst, trade name "SEX-212" manufactured by Dow Corning Toray Silicone Co., Ltd.

TABLE 3

|  |  | Blend 10 (parts by mass) | Blend 11 (parts by mass) | Blend 12 (parts by mass) | Blend 13 (parts by mass) |
|---|---|---|---|---|---|
| Component | Base polymer: BS 621V350 | 100 | 100 | 100 | 100 |
|  | Crosslinker: BS FLD 626V30H2.5 | 2.8 | 5 | 0 | 2.4 |
|  | Heat conductive filler: AS-10 | 500 | 500 | 500 | 500 |
|  | Curing catalyst | 0 | 0 | 1 | 0 |
| Nature |  | Grease | Grease | Grease | Grease |

(3) Joining Catalyst-Containing Sheet and Uncured Composition

The catalyst-containing sheet and the uncured composition were joined as in Tables 4-5. A time until no adhesion or transfer occurred from the surface of the grease-like composition with the proceeding of curing of the uncured composition was measured. The conditions and evaluations are as below.

Thickness of the catalyst-containing sheet: 0.5 mm

Application thickness of the uncured composition: 2.0 mm

TABLE 5

|  | Comp. Ex. 1 | Comp. Ex. 2 |
| --- | --- | --- |
| Catalyst-containing sheet | Blend 2 | Blend 9 |
| Uncured composition | Blend 11 | Blend 12 |
| Curing time | Uncurable | unncurable |
| Nature after curing | No change | No change |

\* Comp. Ex.: Comparative Example

TABLE 4

|  | Ex. 1 | Ex. 2 | Ex. 3 | Ex. 4 | Ex. 5 | Ex. 6 | Ex. 7 | Ex. 8 | Ex. 9 |
| --- | --- | --- | --- | --- | --- | --- | --- | --- | --- |
| Catalyst-containing sheet | Blend 1 | Blend 3 | Blend 4 | Blend 5 | Blend 6 | Blend 7 | Blend 8 | Blend 6 | Blend 3 |
| Uncured composition | Blend 10 | Blend 10 | Blend 10 | Blend 10 | Blend 10 | Blend 10 | Blend 10 | Blend 11 | Blend 13 |
| Hardness after a lapse of 100 hours | 0 Asker C | 0 Asker C | 0 Asker C | 0 Asker C | 0 Asker C | 0 Asker C | 0 Asker C | 30 JIS A | 0 Asker C |
| Nature of uncured composition after curing | Gel | Gel | Gel | Gel | Gel | Gel | Gel | Rubber | Gel |
| Tackiness of uncured composition after curing (N) | 1.2N | 1.2N | 1.2N | 1.2N | 1.2N | 1.2N | 1.2N | 0.4N | 2.0N |
| Heat conductivity (W/m · k) | 1.4 | 1.4 | 1.4 | 1.4 | 1.4 | 1.4 | 1.4 | 1.4 | 1.4 |

\* Ex: Example

<Tackiness Measurement>

A tackiness checker (manufactured by Toyo Seiki Ca, Ltd.) was used in the tackiness measurement. A contact was pressed against an object with a contact load of 5 N and a contact time of 3 seconds, and a stress generated when the contact was separated from the object was detected by a load cell system, <Heat Conductivity Measurement>

Figure 11A:
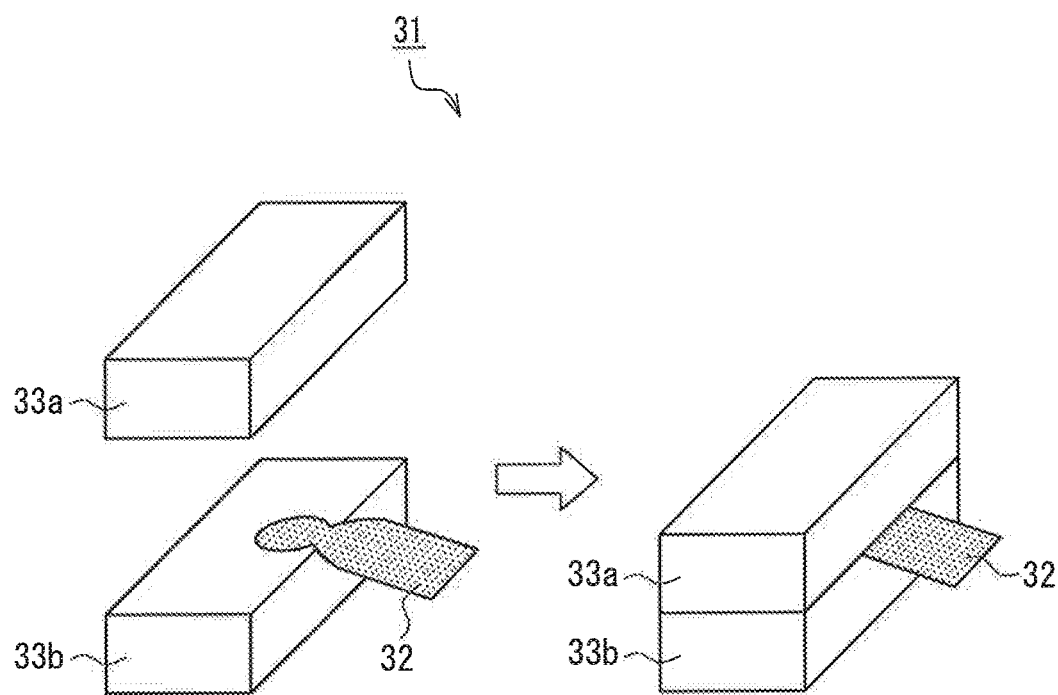
FIGS. 11A and 11B are explanatory views illustrating the method for measuring the heat conductivity of a sample in one example of the present invention.
Figure 11B:
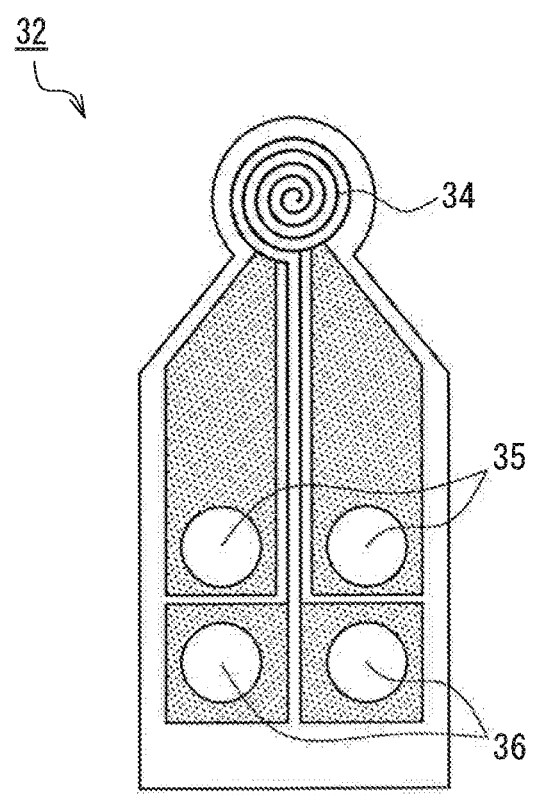

The heat conductivity of the heat conductive sheet was measured by a hot disk (in accordance with ISO/CD 22007-2). As shown in FIG. 11A, in a heat conductivity measuring device 31, a polyimide film sensor 32 was sandwiched between two samples 33a and 33b, and constant power was applied to the sensor 32 to generate a certain amount of heat. Then, the heat characteristics were analyzed from a temperature rise value of the sensor 32. The sensor 32 has a tip 34 with a diameter of 7 mm. As shown in FIG. 11B, the tip 34 has a double spiral structure of electrodes. Moreover, an electrode 35 for an applied current and an electrode 36 for a resistance value (temperature measurement electrode) are located on the lower portion of the sensor 32. The heat conductivity was calculated by the following formula (formula 1).

$$\lambda = \frac{P_0 \cdot D(\tau)}{\Pi^{3/2} \cdot r} \cdot \frac{D(\tau)}{\Delta T(\tau)}$$ [Formula 1]

$\lambda$: Heat conductivity (W/m·k)
$P_0$: Constant power (W)
r: Radius of sensor (m)
$\tau$: $\sqrt{\alpha \cdot t / r^2}$
$\alpha$: Heat diffusivity of sample (m²/s)
t: Measuring time (s)
$D(\tau)$: Non-dimensional function of r
$\Delta T(\tau)$: Temperature rise of sensor (K)

The results confirmed the following.

(1) From Example 1 and Comparative Example 1, the uncured composition does not cure if the catalyst-containing sheet does not contain a catalyst.

(2) From Examples 1-4, the nature of the catalyst sheet may be any of uncured rubber addition cured gel, peroxide vulcanized rubber, and addition cured rubber.

(3) From Examples 5-7, the curing rate of the uncured composition is adjustable by the amount of the catalyst of the catalyst sheet.

(4) From Examples 5, 8 and 9, the nature of the uncured composition after curing is adjustable by the blending of the uncured composition.

(5) From Comparative Example 2, even when a crosslinker is added to the catalyst sheet not containing a catalyst and a catalyst is added to the uncured composition, the crosslinker does not permeate through the uncured composition to cure the composition. However, the catalyst permeates from the uncured composition to cure the catalyst sheet.

INDUSTRIAL APPLICABILITY

The heat conductive sheet of the present invention is useful as a heat dissipater to be placed between heat generating parts and heat dissipating parts of electrical and electronic components (transformers, amplifiers, batteries, LEDs, and household electric appliances), information communication modules including an optical communication device, and in-vehicle applications. Further, the heat conductive sheet of the present invention is useful as a heat dissipater of electronic components including a semiconductor.

DESCRIPTION OF REFERENCE NUMERALS

1 Cured sheet layer
2 Uncured composition 3a, 3b, 4a, 4b Protective film
5 Heat generating electronic component
6 Heat sink
7 Tip part of automatic mounting machine
8, 9 Air direction of tip part of automatic mounting machine
10 Circuit board
11 Heat generating part of electronic component
12 Dispenser
13a-13c Uncured composition
14, 15, 21 Electrical or electronic component
16 Tray
17, 23 Rod-shaped uncured composition
18 Tube
19 Bobbin
20 Ribbon-shaped uncured composition
22 Cavity (recess)
24 Metal plate
25 Heat conductive silicone rubber cured sheet
26 Dispensed uncured composition
31 Heat conductivity measuring device
32 Polyimide film sensor
33a, 33b Sample
34 Sensor tip
35 Electrode for an applied current
36 Electrode for a resistance value (temperature measurement electrode)

The invention claimed is:

1. A heat conductive member comprising a heat conductive sheet containing a curing reaction catalyst and a heat conductive uncured composition not containing a curing reaction catalyst,
wherein the heat conductive uncured composition not containing a curing reaction catalyst is joined to at least one principal surface of the heat conductive sheet containing thea curing reaction catalyst,
the heat conductive sheet containing the curing reaction catalyst contains the curing reaction catalyst in an amount necessary to cure the heat conductive uncured composition, and
the heat conductive uncured composition comprises:
(A) base polymer component: 100 parts by weight of linear organopolysiloxane having an average of two or more alkenyl groups per molecule, in which the alkenyl groups are bonded to silicon atoms at both ends of the molecular chain;
(B) crosslinking component: less than 1 mol of organohydrogenpolysiloxane having an average of two or more hydrogen atoms bonded to silicon atoms per molecule, with respect to 1 mol of the alkenyl groups bonded to the silicon atoms contained in the component A; and
(C) heat conductive particles: 100 to 3000 parts by weight with respect to 100 parts by weight of the component A;
wherein a heat conductive filler is mixed in the heat conductive sheet containing the curing reaction catalyst and heat conductivity across the heat conductive member is 0.5 W/mk or more.

2. The heat conductive member according to claim 1, wherein the amount of the curing reaction catalyst in the heat conductive sheet is 1 ppm to 3500 ppm.

3. The heat conductive member according to claim 1, wherein the curing reaction catalyst is a platinum group metal catalyst.

4. The heat conductive member according to claim 1, wherein the heat conductive sheet containing the curing reaction catalyst is at least one selected from a silicone rubber sheet, a silicone gel sheet, a natural rubber sheet, a synthetic rubber sheet, and a paraffin sheet.

5. The heat conductive member according to claim 1, wherein a thickness of the heat conductive sheet containing the curing reaction catalyst is 0.1 mm to 1.5 mm.

6. The heat conductive member according to claim 1, wherein the heat conductive uncured composition cures by an addition reaction or a condensation reaction.

7. The heat conductive member according to claim 1, wherein the heat conductive uncured composition has tackiness after curing.

8. The heat conductive member according to claim 1, wherein the heat conductive uncured composition is at least one selected from uncured silicone rubber, uncured silicone gel, uncured silicone grease, uncured silicone oil, and uncured adhesive silicone rubber.

9. The heat conductive member according to claim 1, wherein the heat conductive uncured composition is in a form of a putty sheet or a ribbon, or in a state extruded from at least one container selected from a dispenser, a syringe, and a tube.

10. A mounting method using the heat conductive member according to claim 1, comprising:
joining the heat conductive uncured composition not containing a curing reaction catalyst to at least one surface of the heat conductive sheet containing the curing reaction catalyst; and
curing the heat conductive uncured composition by diffusion of the curing reaction catalyst from the heat conductive sheet into the heat conductive uncured composition,
wherein the heat conductive uncured composition comprises:
(A) base polymer component: 100 parts by weight of linear organopolysiloxane having an average of two or more alkenyl groups per molecule, in which the alkenyl groups are bonded to silicon atoms at both ends of the molecular chain;
(B) crosslinking component: less than 1 mol of organohydrogenpolysiloxane having an average of two or more hydrogen atoms bonded to silicon atoms per molecule, with respect to 1 mol of the alkenyl groups bonded to the silicon atoms contained in the component A; and
(C) heat conductive particles: 100 to 3000 parts by weight with respect to 100 parts by weight of the component A;
wherein a heat conductive filler is mixed in the heat conductive sheet containing the curing reaction catalyst and heat conductivity across the heat conductive member is 0.5 W/m·k or more.

11. The mounting method according to claim 10, comprising joining the heat conductive uncured composition not containing a curing reaction catalyst to at least one surface of the heat conductive sheet containing the curing reaction catalyst, and then incorporating the heat conductive member into an electrical or electronic component.

12. The mounting method according to claim 10, comprising joining the heat conductive uncured composition not containing a curing reaction catalyst to an electrical or electronic component and then pressure-bonding the heat conductive uncured composition to at least one surface of the heat conductive sheet containing the curing reaction catalyst.

13. The mounting method according to claim 10, comprising joining the heat conductive sheet containing the curing reaction catalyst to an electrical or electronic component, and then pressure-bonding the heat conductive sheet to the heat conductive uncured composition not containing a curing reaction catalyst.

14. The mounting method according to claim 10, wherein a time to cure the heat conductive uncured composition is 4 hours to 48 hours at a room temperature of 25° C.

15. The mounting method according to claim 10, wherein the heat conductive uncured composition is supplied to a mounting process in a form of a putty sheet or a ribbon, or in a state of being contained in a dispenser, a syringe, or a tube.

16. A joining method using the heat conductive member according to claim 1, comprising:

joining the heat conductive uncured composition not containing a curing reaction catalyst to at least one surface of the heat conductive sheet containing the curing reaction catalyst;

joining the heat conductive uncured composition and an object in contact with the heat conductive uncured composition; and curing the heat conductive uncured composition by diffusion of the curing reaction catalyst from the heat conductive sheet into the heat conductive uncured composition, wherein the heat conductive uncured composition comprises:

(A) base polymer component: 100 parts by weight of linear organopolysiloxane having an average of two or more alkenyl groups per molecule, in which the alkenyl groups are bonded to silicon atoms at both ends of the molecular chain;

(B) crosslinking component: less than 1 mol of organohydrogenpolysiloxane having an average of two or more hydrogen atoms bonded to silicon atoms per molecule, with respect to 1 mol of the alkenyl groups bonded to the silicon atoms contained in the component A; and (C) heat conductive particles: 100 to 3000 parts by weight with respect to 100 parts by weight of the component A;

wherein a heat conductive filler is mixed in the heat conductive sheet containing the curing reaction catalyst and heat conductivity across the heat conductive member is 0.5 W/m·k or more.

* * * * *